(12) United States Patent
Kornack et al.

(10) Patent No.: US 9,575,144 B2
(45) Date of Patent: Feb. 21, 2017

(54) SYSTEM AND METHOD FOR ATOM-MODULATED, LOW-DRIFT SENSOR

(71) Applicants: Thomas Whitmore Kornack, Princeton, NJ (US); Elizabeth Lee Foley, Princeton, NJ (US)

(72) Inventors: Thomas Whitmore Kornack, Princeton, NJ (US); Elizabeth Lee Foley, Princeton, NJ (US)

(73) Assignee: TWINLEAF LLC, Princeton, NJ (US)

( * ) Notice: Subject to any disclaimer, the term of this patent is extended or adjusted under 35 U.S.C. 154(b) by 662 days.

(21) Appl. No.: 14/054,746

(22) Filed: Oct. 15, 2013

(65) Prior Publication Data

US 2014/0247045 A1 Sep. 4, 2014

Related U.S. Application Data

(60) Provisional application No. 61/713,331, filed on Oct. 12, 2012.

(51) Int. Cl.
*G01R 33/26* (2006.01)

(52) U.S. Cl.
CPC .................... *G01R 33/26* (2013.01)

(58) Field of Classification Search
CPC ...................................... G01R 33/26
See application file for complete search history.

(56) References Cited

U.S. PATENT DOCUMENTS

| 2004/0140799 | A1* | 7/2004 | Romalis | G01R 33/02 324/301 |
| 2007/0266784 | A1* | 11/2007 | Lust | G01C 19/62 73/504.05 |
| 2010/0090697 | A1* | 4/2010 | Savukov | G01R 33/26 324/309 |
| 2012/0112749 | A1* | 5/2012 | Budker | G01R 33/1284 324/318 |

* cited by examiner

*Primary Examiner* — Rodney Bonnette
(74) *Attorney, Agent, or Firm* — Maldjian Law Group LLC

(57) ABSTRACT

A compact, high-sensitivity magnetometer, including: an optical interface to accept a linearly polarized first light; a pump light source to produce a circularly polarized pump light; a vapor cell comprising a sealed vessel containing an alkali-metal gas, a first input port to receive the first light, a second input port to accept the pump light from a direction perpendicular to the first light, and an output port configured to produce a second light; an electromagnetic source configured to apply an electromagnetic field to the vapor cell at a direction perpendicular to the first light and the pump light; a second linear polarizer, having an axis of polarization perpendicular to the first light, the second polarizer configured to receive the second light and to produce a third light; and a photodetector configured to receive the third light, to produce an intensity measurement of the third light.

44 Claims, 6 Drawing Sheets

FIG. 1 Prior Art
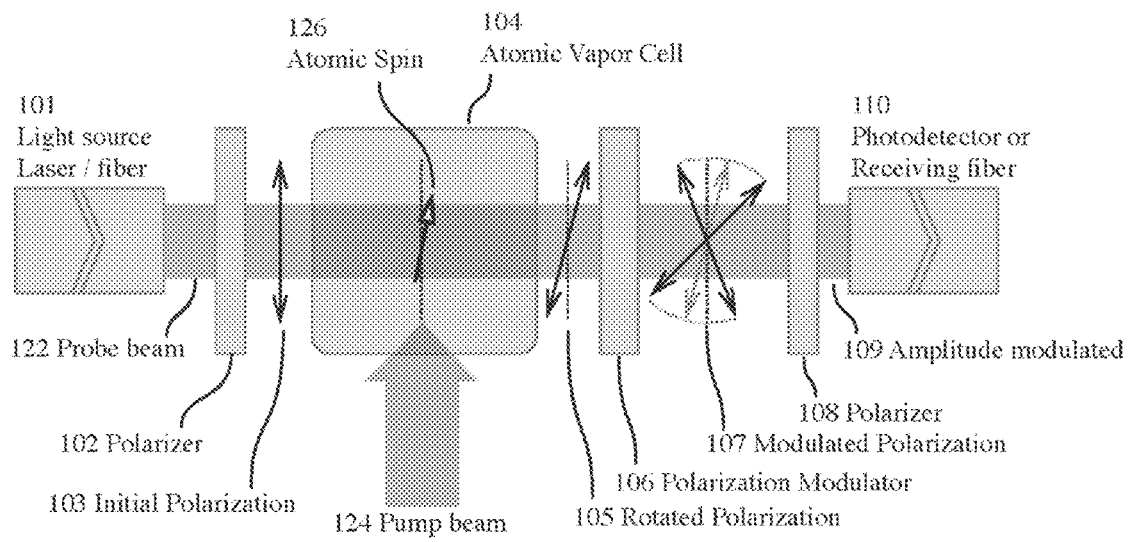
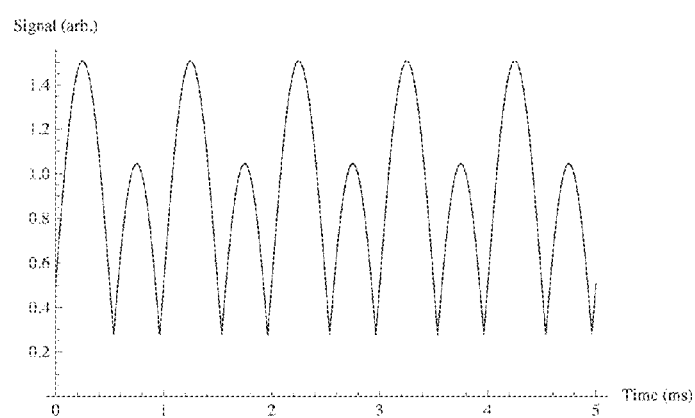
FIG. 2
200

300

700

800

SYSTEM AND METHOD FOR ATOM-MODULATED, LOW-DRIFT SENSOR

CROSS-REFERENCE TO RELATED APPLICATIONS

This application claims the benefit of U.S. Provisional Patent Application Ser. No. 61/713,331, filed on Oct. 12, 2012, the entire content of which is hereby incorporated by reference in its entirety.

GOVERNMENT LICENSE RIGHTS

This invention was made with government support under contract HQ0147-11-C-7620 awarded by the U.S. Department of Defense. The government has certain rights in the invention.

BACKGROUND

Field of the Invention

Embodiments of the present invention generally relate to highly sensitive magnetometers, and, in particular, to a system and method for making magnetic measurements by modulated excitation of atoms. More particularly, the invention relates to atomic magnetometers that rely on polarizing alkali metal vapor, and probing the state of magnetization of the polarized metal atoms.

Description of Related Art

Atomic magnetometers are based on detection of Larmor spin precession of optically pumped atoms. A spin-exchange relaxation-free ("SERF") magnetometer achieves very high magnetic field sensitivity by monitoring a high density vapor of alkali metal atoms precessing in a near-zero magnetic field. In a magnetometer and/or a gyroscope based on that operating principle, it is necessary to measure the precession (i.e., rotation) of the atomic spin state due to the magnetic field with very high sensitivity. One of the most sensitive methods for measuring the Larmor spin precession is via the optical rotation of linearly polarized light propagating through the polarized alkali metal vapor. The highest polarization rotation sensitivity is achieved using two orthogonal polarizers, which are configured to extinguish the light, with the magnetometer cell and a polarization modulator between them. Magnetometers that use a polarization modulation technique use various types of polarization modulator subsystems such as a photoelastic modulator ("PEM") or an electro-optic modulator ("EOM"). The use of a separate polarization modulator adds to the size and complexity of the sensor and can introduce noise and drift. Operation of some atomic magnetometers of the related art is described in U.S. Pat. No. 7,145,333, the entire content of which is hereby incorporated by reference in its entirety.

Therefore, a need exists to provide a miniature, highly sensitive atomic magnetometer having a high level of atomic spin coherence. The atomic magnetometers should have relatively low cost and low measurement drift at low frequency compared to the known art.

SUMMARY

Embodiments in accordance with the present invention eliminate the discrete polarization modulators of the known art, and replace it with modulation of alkali-metal atoms in a vapor cell via a field coil. This technique also enables a unique, ultra-low-drift polarimeter apparatus designed with a single polarizer (rather than two polarizers) for both polarization and analysis. Embodiments substantially eliminate errors caused by thermal expansion or contraction of the single polarizer.

Eliminating the modulator and using atoms to modulate the light is an enormous benefit for miniaturizing sensors, lowering their cost and improving measurement drift. The use of a single polarizer for both polarization and analysis results in a much smaller low frequency drift. This is particularly important for atom-based sensors such as navigation-grade atomic spin gyroscopes that rely on very long-term stability.

Embodiments of a compact, high-sensitivity magnetometer apparatus may include: an optical interface to accept a linearly polarized first light; a pump light source to produce a circularly polarized pump light; a vapor cell comprising a sealed vessel containing an alkali-metal gas, a first input port to receive the first light, a second input port to accept the pump light from a direction perpendicular to the first light, and an output port configured to produce a second light; an electromagnetic source configured to apply an electromagnetic field to the vapor cell at a direction perpendicular to the first light and the pump light; a second linear polarizer, having an axis of polarization perpendicular to the first light, the second polarizer configured to receive the second light and to produce a third light; and a photodetector configured to receive the third light, to produce an intensity measurement of the third light.

In some embodiments of an apparatus, the optical interface may include a first linear polarizer having a predetermined first axis of polarization, the first polarizer configured to receive a probe light and to pass the probe light through the first linear polarizer in order to produce the first light.

In some embodiments of an apparatus, the output port of the vapor cell may include the input port of the vapor cell for the first light.

Some embodiments of an apparatus further include a light source to produce the first light.

In some embodiments of an apparatus, the electromagnetic field includes a time-varying field modulation. In other embodiments, the electromagnetic field may further be modulated at a frequency above the apparatus bandwidth, from about 100 Hz to about 5 kHz. In other embodiments, the electromagnetic field is modulated with a field strength of less than the SERF regime field limit. In other embodiments, the electromagnetic field is modulated with a field strength of about 10 nT peak-to-peak.

Some embodiments of an apparatus further include a three-axis electromagnetic coil configured to cancel an ambient external electromagnetic field. In some embodiments of an apparatus, the three-axis electromagnetic coil comprises the electromagnetic source.

Some embodiments of an apparatus further include a mirror configured to reflect the second light into the vapor cell, wherein the second linear polarizer comprises the first linear polarizer.

In some embodiments of an apparatus, a single birefringent crystal comprises the first linear polarizer and the second linear polarizer.

Embodiments of a compact, high-sensitivity magnetometer system may include: an optics section including the apparatus, and a processor section to control the optics section, the processor section including a processor coupled to a memory; a light source control module coupled to the processor, the light source control module configured to control a source of the first light and the pump light source; a light detector control module, the light detector control module configured to control the light detector; and an electromagnetic source control module, the electromagnetic source control module configured to control the electromagnetic source.

The preceding is a simplified summary of embodiments of the disclosure to provide an understanding of some aspects of the disclosure. This summary is neither an extensive nor exhaustive overview of the disclosure and its various embodiments. It is intended neither to identify key or critical elements of the disclosure nor to delineate the scope of the disclosure but to present selected concepts of the disclosure in a simplified form as an introduction to the more detailed description presented below. As will be appreciated, other embodiments of the disclosure are possible utilizing, alone or in combination, one or more of the features set forth above or described in detail below.

BRIEF DESCRIPTION OF THE DRAWINGS

The above and still further features and advantages of the present invention will become apparent upon consideration of the following detailed description of embodiments thereof, especially when taken in conjunction with the accompanying drawings wherein like reference numerals in the various figures are utilized to designate like components, and wherein:

FIG. 1 illustrates a block diagram depicting an atomic magnetometer in accordance with the background art;

FIG. 2 illustrates a typical modulated polarimeter signal that is used when making magnetometer measurements in accordance with an embodiment of the present invention;

Figure 3:
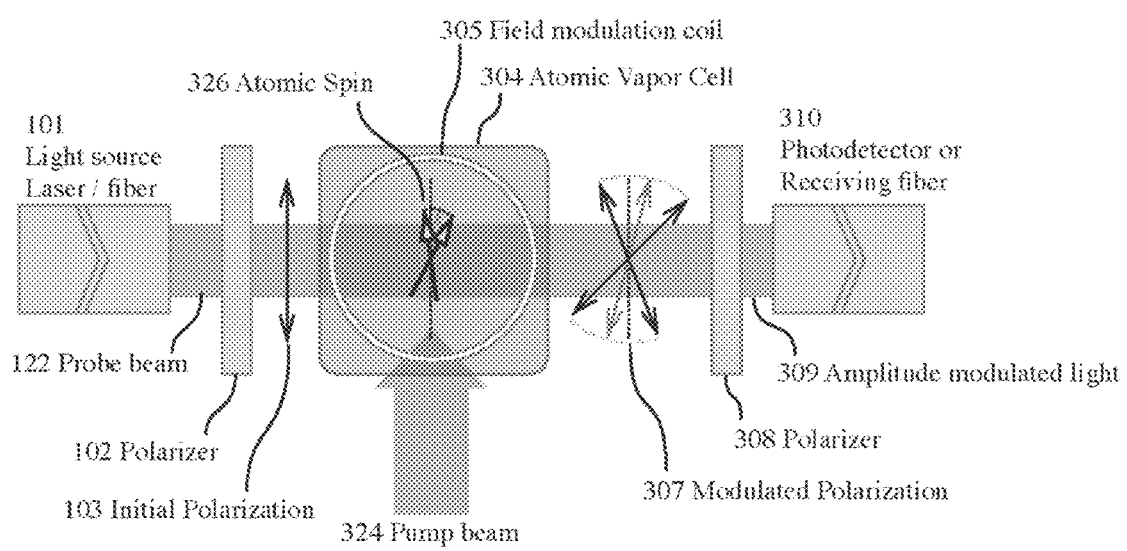
FIG. 3 illustrates a block diagram depicting an atom-modulated, low drift atomic magnetometer in accordance with an embodiment of the present invention.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including but not limited to. To facilitate understanding, like reference numerals have been used, where possible, to designate like elements common to the figures. Optional portions of the figures may be illustrated using dashed or dotted lines, unless the context of usage indicates otherwise.

DETAILED DESCRIPTION

In the following detailed description, numerous specific details are set forth in order to provide a thorough understanding of embodiments or other examples described herein. In some instances, well-known methods, procedures, components and circuits have not been described in detail, so as to not obscure the following description. Further, the examples disclosed are for exemplary purposes only and other examples may be employed in lieu of, or in combination with, the examples disclosed. It should also be noted the examples presented herein should not be construed as limiting of the scope of embodiments of the present invention, as other equally effective examples are possible and likely.

The exemplary systems and methods of this disclosure may also be described in relation to software, modules, and associated hardware. However, to avoid unnecessarily obscuring the present disclosure, the following description omits well-known structures, components and devices that may be shown in block diagram form, are well known, or are otherwise summarized.

Embodiments in accordance with the present invention provide an atomic magnetometer based on atomic spin detection, with improvements to polarization detection and/or polarization modulation, in order to overcome drawbacks of the known art. An atomic magnetometer based on the operating principles disclosed herein may be incorporated into other instrumentation such as a gyroscope based on atomic spin. Embodiments eliminate the need for a polarization modulator (e.g., PEM and/or EOM) without substantially affecting sensitivity of the magnetometer. Embodiments use a single polarizer design with atom modulation, thereby providing significantly improved long-term drift such that the magnetometer or gyroscope requires no manual alignment or adjustment.

Embodiments in accordance with the present invention may modulate the angle of the alkali-metal atoms, using a magnetic field modulation with sufficiently low amplitude that the atoms tend to remain within the SERF regime, and providing an atomic-spin-coherence-preserving, quantum non-demolition measurement technique and apparatus.

Furthermore, embodiments in accordance with the present invention do not require an excitation coil magnetic field to be uniform throughout the sensor volume. The modulation field needs to operate only on a fraction of the atoms to provide sufficient probe beam polarization modulation. This may be advantageous in applications where the modulation coils are smaller than or comparable to the vapor cell size and the magnetometers are packed into dense arrays, for example in medical imaging applications of the brain and heart.

A circularly polarized pump beam tuned to an atomic spin absorption line optically pumps and polarizes the alkali-metal atoms in a vapor cell. The atoms precess or rotate in the presence of a magnetic field. The orientation of the spins is monitored using an orthogonal probe beam that is linearly polarized and detuned to the side of an atomic absorption line to measure the orientation of the atomic spin via optical rotation. The optical rotation imparted by the atoms is proportional to the projection of the spins along the probe beam axis; if the atomic spins are perpendicular to the probe beam then no rotation is imparted.

To measure the orientation of the atoms with very high precision, a field coil with modulated current may be used to cause the atoms to rotate at the same frequency. The atoms rotate due to the field of interest plus this field modulation. The atoms impart the modulation to the linearly polarized light angle via optical rotation. In some embodiments, the total modulation angle of the linearly polarized probe beam is a much as 5 degrees. The orientation of the atoms due to interaction with external magnetic fields of interest generally adds a small rotation angle, which is encoded at high frequency by the modulated light and is demodulated after detection and amplification using a lock-in amplifier.

The amplitude of the field modulation produced by the field coil must be sufficient to generate a second harmonic signal through crossed polarizers, overcoming any misalignments and birefringence imparted by optical components in the system. In some embodiments, the modulation frequency is about 1 kHz. The atoms' frequency response or bandwidth is determined by their spin coherence time. Higher frequency field modulation results in a smaller atom response and a smaller polarization angular modulation. A higher modulation frequency may be used with a higher amplitude modulation field, but the higher amplitude modulation field may exceed the SERF regime, resulting in shorter atomic spin coherence time. A lower modulation frequency may also be used, though the maximum usable bandwidth of the magnetometer would be half the modulation frequency. The SERF regime field limit depends on apparatus parameters.

One source of drift in the polarization measurement is drift in the relative angle between the initial and final polarizers. Thermal stress on the glass elements also affects the polarization state with stress-induced birefringence. Large thermal gradients and temperature drift in the system exacerbate the stress-induced birefringence in the optics and cause polarimeter drift due to small changes in the optical birefringence.

FIG. 1 illustrates a magnetometer of the background art that uses a polarization modulator subsystem such as PEM or EOM. A light source such as light source 101 (e.g., laser diode, fiber laser, etc.) provides probe beam 122 that is passed through a linear polarizer 102 to produce a light 103 having an initial, known polarization state. Light 103 is passed through a hermetically sealed atomic vapor cell 104. Atomic vapor cell 104 is optically pumped by pump beam 124. Atomic spin 126 of the atoms within the atomic vapor cell 104 imparts upon light 103 a change in the polarization state of the light passing through, producing a light 105 having a rotated polarization state compared to light 103. Light 105 is passed through a polarization modulator 106, which produces a light 107 having a modulated polarization state, as illustrated by the plurality of polarization vectors for light 107 in FIG. 1. Some traditional magnetometers (not illustrated) place polarization modulator 106 before atomic vapor cell 104 rather than after atomic vapor cell 104. Light 107 is passed through a polarizer 108, having an axis of polarization that is perpendicular to the axis of polarizer 102 in order to produce a light 109. Light 109 is passed to a detector 110 such as a photodetector or a receiving fiber photodetector.

A drawback to usage of the configuration of FIG. 1 as a compact polarimeter is the size and properties of polarization modulator 106. The use of a PEM in a compact sensor is not possible because the field required to operate it would completely overwhelm the sensor. The use of an EOM in the sensor is possible, but typical EOMs are prone to thermal drift, which limits low frequency performance. Embodiments improve upon FIG. 1 by eliminating polarization modulator 106 and instead use the alkali-metal atoms in atomic vapor cell 104 to modulate the light. Embodiments excite the alkali-metal atoms by using a field coil to apply an appropriately-modulated magnetic with sufficient amplitude to generate a second harmonic signal through cross polarizers.

The magnetic field modulation frequency is typically a few hundred Hertz above the magnetometer bandwidth, e.g., 1 kHz typical. In some embodiments, the magnetic field modulation frequency may range from about 100 Hz to about 5 kHz. Embodiments provide a frequency response that is Lorentzian in form and has a bandwidth defined by the signal response half-width half-maximum at about 25 Hz for a high quality SERF magnetometer.

Lower modulation field strength is required for usage with lower modulation frequency. In some embodiments, the modulation field strength typically may be about 10 nT peak, and will be less than 40 nT peak to stay within the SERF regime. The magnetic field modulation is applied perpendicularly to both the pump beam and the probe beam. Field uniformity is not typically an important parameter to control.

FIG. 2 illustrates a typical modulated polarimeter signal 200 intensity as a function of time, representing the signal at the output of detector 110. The modulated signal may be produced by the apparatus of FIG. 1 or by embodiments in accordance with the present invention. For example, if signal 200 is produced using the apparatus of FIG. 1, then using modulator 106 to modulate the angle of polarization at a frequency of about 1 kHz around the polarimeter extinction angle will induce a modulation of light 107 that is approximately equal to a rectified sine wave having a frequency of about 2 kHz (i.e., double the frequency before rectification). Rotations of interest generated by the atoms in the atomic vapor cell 104 generate a periodic asymmetry in signal 200, which registers as an amplitude modulation ("AM") on signal 200. By demodulating at the rectified signal 200 using a lock-in amplifier, a measure of the rotation of interest may be obtained from the magnitude of the AM modulation. An advantage of this technique is that it provides high rotation sensitivity, typically limited by the quantum shot noise of the intensity of light used in the measurement. The modulated signal is offset by imperfections in the polarimeter, which is why the light does not completely extinguish when the polarization is rotated through the extinction angle twice per modulation period. The amplitude modulation should be adjusted so that the offset is a small fraction of the total signal.

FIG. 3 illustrates a block diagram of an embodiment of magnetometer 300 in accordance with the present invention, in which a field coil 305 is used to modulate atoms, and thereby eliminating a need for an external optical modulator. Magnetometer 300 may include light source 101 (e.g., laser diode, fiber laser, etc.) that provides a probe beam 122, which is passed through a linear polarizer 102 to produce a light 103 having an initial, known polarization state. Alternatively, magnetometer 300 may include an optical interface to an externally-provided source of light. Light 103 is passed through an atomic vapor cell 304 that is configured in accordance with an embodiment of the present invention. A pump beam 324 optically pumps atomic vapor cell 304. Atomic vapor cell 304 may be electromagnetically coupled to a modulation field coil 305.

Modulation field coil 305 may be configured as part of an existing 3-axis coil (not illustrated in FIG. 3) that may be present. The 3-axis coil, if provided, may be configured to substantially surround magnetometer 300 to cancel an ambient external electromagnetic field. Cancelling the ambient magnetic field may be used to achieve sufficiently low ambient or residual field for operation in the SERF regime. The SERF regime field limit depends on apparatus parameters. Alternatively, modulation field coil 305 may include a dedicated, small field coil embedded in the sensor 300 adjacent to vapor cell 304. In some embodiments, modulation field coil 305 may be configured as one or more coils that substantially encircle or surround atomic vapor cell 304. Modulation field coil 305 generates a modulation field perpendicular to both pump and probe beams. In at least some applications, vapor cell 304 is kept within operating ranges of temperature and pressure specific to the alkali-metal used (e.g., cell may be heated to within the temperature range 120-200 C for rubidium). Modulation field coil 305 acts to modulate the polarization state of alkali-metal atoms within atomic vapor cell 304, as indicated by the plurality of atomic spin states 326 illustrated in FIG. 3.

Atomic vapor cell 304 produces a light 307 having a modulated polarization state, as indicated in FIG. 3 by a plurality of polarization vectors associated with light 307. Light 307 is passed through a polarizer 308, which is a polarizer oriented orthogonally to polarizer 102, producing a light 309. Light 309 is passed to a detector 310 such as a photodetector or a receiving fiber photodetector. Detector 310 may be integrated into magnetometer 300, or magnetometer 300 may provide an appropriate optical interface to an external detector 310.

Magnetometer 300 generates polarization angular modulation by using modulation field coil 305 to apply an appropriate magnetic field modulation within atomic vapor cell 304 at a frequency somewhat above the bandwidth of the magnetometer, such as a few hundred Hertz, with sufficient amplitude to generate an amplitude modulation on the signal through crossed polarizers 308. In one embodiment, modulation field coil 305 may be modulated at a frequency of about 500 Hz to about 1 kHz, which is on an edge of a normal magnetometer/gyroscope bandwidth and outside of a typical bandwidth of interest of about 0 Hz to about 100 Hz.

The amplitude of modulation of atoms in atomic vapor cell 304 is in general chosen to be such that the atoms in atomic vapor cell 304 are in a low-field SERF regime. The SERF regime field limit depends on apparatus parameters. The maximum magnetic field permitted in the SERF regime depends on the collision rate experienced by the alkali metal. This may be affected by the particular alkali element used and the density of the alkali vapor. In one embodiment, the amplitude of modulation may be around half the SERF field limit of 50 nT. For example, with modulation of 25 nT, magnetometer 300 is sensitive to signals of interest up to about 25 nT, without leaving the SERF regime, because the amplitude modulation of atoms in atomic vapor cell 304 is kept below approximately 50 nT at all times.

The frequency of modulation of atoms in atomic vapor cell 304 is chosen to be above a magnetometer bandwidth of interest. For example, if the magnetometer bandwidth of interest is 50 Hz, the field coil modulation frequency may be set anywhere above 100 Hz. The minimum modulation frequency may be at least double the bandwidth of interest because of the need to demodulate the signal. The modulation frequency may be increased until the atom response becomes too small to detect. The atom response of magnetometer 300 is determined by a Lorentzian curve L given by $L=b^2/(f^2+b^2)$, where b is the bandwidth of magnetometer 300 and f is the frequency of the field modulation. Thus, increasing the modulation frequency from 100 Hz to 1 kHz will reduce the atom modulation amplitude by a factor of 80. To utilize the dynamic range of the detector system, the modulation amplitude may be greater than any signal offset due to birefringence or polarimeter misalignment.

Figure 4A:
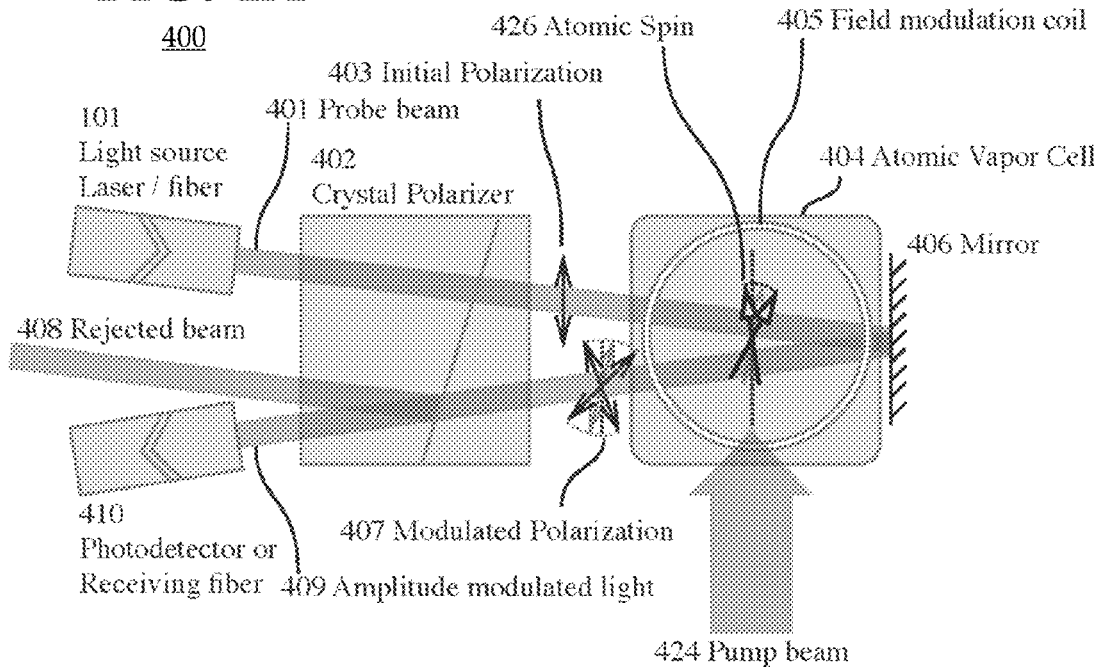
FIG. 4A illustrates a block diagram depicting an atom-modulated, low drift atomic magnetometer in accordance with an embodiment of the present invention.

FIG. 4A illustrates a block diagram of an embodiment of magnetometer 400 in accordance with the present invention, in which a crystal polarizer may be used for both polarization and analysis in a retro-reflected beam geometry, in order to create a substantially drift-free polarimeter.

Magnetometer 400 includes at least a crystal polarizer 402, an atomic vapor cell 404, a modulation excitation source 405 (e.g., a field coil) and a mirror 406.

Magnetometer 400 may also include light source 101 (e.g., laser diode, fiber laser, etc.) that provides probe beam 401, or alternatively, magnetometer 400 may include an optical interface to an externally-provided source of light that provides probe beam 401. Probe beam 401 passes through crystal polarizer 402 to produce light 403 having a known, initial state of polarization. Light 403 passes through atomic vapor cell 404, in which the atoms within are excited by modulation excitation source 405. Simultaneously, pump beam 424 may optically pump atomic vapor cell 404. Light traversing atomic vapor cell 404 is then reflected by mirror 406. Mirror 406 may be provided in substantially any form, such as an external mirror, a mirrored interior or exterior surface of atomic vapor cell 404. Mirror 406 may be positioned such that a reflected beam produced by mirror 406 will pass through atomic vapor cell 404 over substantially the same path as the input beam. An advantage of having the input and output light overlapping is that any polarization obtained due to stress induced birefringence in the glass cell is removed upon reflection. Mirror 406 may be further positioned such that a path taken through atomic vapor cell 404 by the reflected beam is different than the path taken by light 403 after entry into atomic vapor cell 404. The reflected beam, after passing through atomic vapor cell 404, will result in light 407 having a modulated polarization state. Light 407 enters crystal polarizer 402, which is a birefringent polarizer. Crystal polarizer 402 splits an incoming beam 407 into a rejected beam 408 and an orthogonally polarized, amplitude modulated beam 409. Rejected beam 408 and orthogonally polarized, amplitude modulated beam 409 are orthogonally polarized to each other. Rejected beam 408 will be co-polarized with probe beam 401 because a single polarizer is used.

In some embodiments, mirror 406 may be aligned such that the reflected beam will exit from vapor cell 404 through a same port as used by light 403 to enter vapor cell 404, i.e., the output port of the reflected beam is also used as an input port for light 403.

After exiting crystal polarizer 402, orthogonally polarized, amplitude modulated beam 409 is detected by a detector 410 such as a photodetector or a receiving fiber photodetector. Rejected beam 408 may be used for other purposes, such as monitoring the light level or absorption (not illustrated in FIG. 4A). Detector 410 may be integrated into magnetometer 400, or magnetometer 400 may provide an appropriate optical interface to an external detector 410. Since embodiment 400 passes light twice through atomic vapor cell 404, the modulation amplitude produced by modulation excitation source 405 may be reduced by a factor of two to keep operation of embodiment 400 within the SERF regime. Although the incident beam and reflected beam may spatially overlap inside atomic vapor cell 404, no interference or diffraction effects have been observed.

Magnetometer 400, by utilizing a reflected beam design with a single polarizer crystal 402, substantially eliminates polarizer/analyzer drift and tends to suppress drift of stress-induced birefringence drift in the glass of the cell. Substantially any beamsplitting polarizer may be used so long as it separates the two polarization states into distinct beams. By using the same polarizer for both polarization and analysis, polarimeter drift is suppressed. First order drift due to changing birefringence of the glass is suppressed by the double-pass arrangement, resulting only in a shift in signal offset that is removed by modulation. The double-pass arrangement substantially eliminates the effect of stress in the polarizer glass upon polarization state, because magnetometer 400 is sensitive to the difference in polarization state between beam 403 (after it passed through polarizer 403) and beam 407 (after it passed through polarizer 403), and any birefringence changes in polarizer 403 affects both beams equally.

Figure 4B:
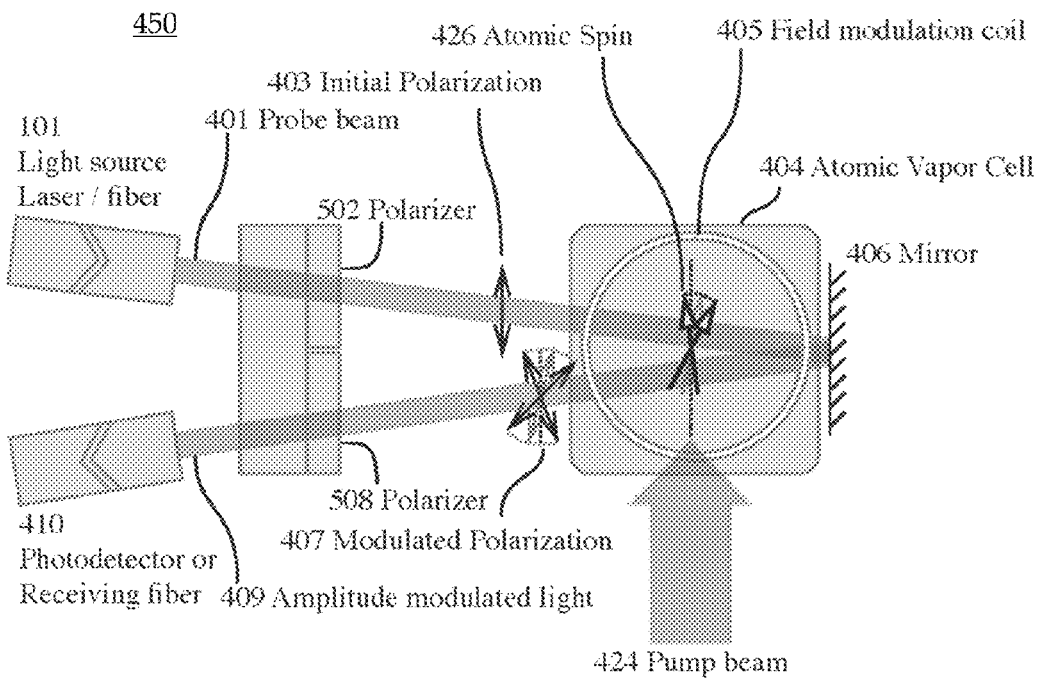
FIG. 4B illustrates a block diagram depicting an atom-modulated, low drift atomic magnetometer in accordance with another embodiment of the present invention.

FIG. 4B illustrates a block diagram of an embodiment of magnetometer 450 in accordance with the present invention, in which two separate linear polarizers 502, 508 may be used in a retro-reflected beam geometry, in order to create a substantially drift-free polarimeter. Polarizer 502 may be used to polarize probe beam 401 to produce a light 403 having a predetermined polarization. After light 403 traverses atomic vapor cell 404 a first time, is reflected by mirror 406 and traverses atomic vapor cell 404 a second time, that light is polarized by polarizer 508, such that polarizer 508 is oriented to have an axis of polarization that is substantially perpendicular to the axis of polarization of polarizer 502.

Figure 5:
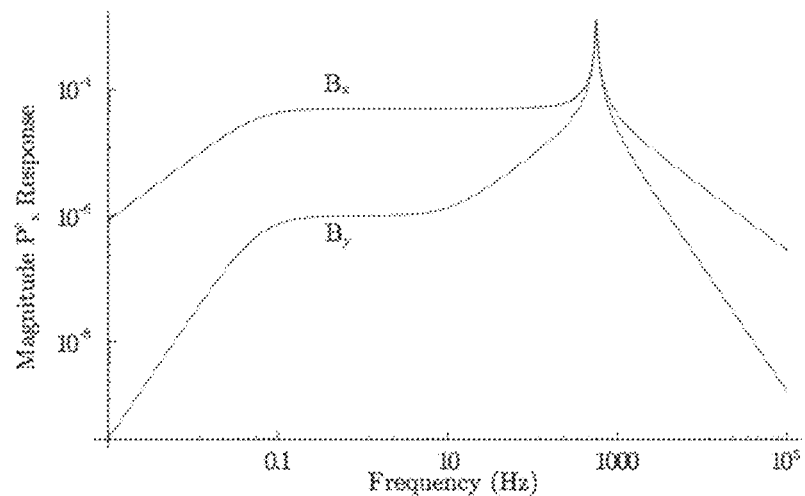
FIG. 5 illustrates co-magnetometer gyroscope signal simulated as a function of frequency.

Embodiments in accordance with the present invention may be usable an atomic spin co-magnetometer gyroscope. In such an application, the atom modulation operation may be enhanced by tuning the atomic vapor cell modulation to an alkali metal resonance, which is shifted away from zero field by a collisional or "contact" interaction with a nuclear-spin-polarized noble gas. FIG. 5 illustrates a numerical simulation of this resonance magnitude of the co-magnetometer gyroscope signal as a function of frequency, for both $B_x$ and $B_y$, representing the x-axis and y-axis, respectively. Note a resonance around 1 kHz that may be exploited for atom modulation. This facilitates atom modulation operation with modulation field amplitude significantly lower than in a magnetometer.

As used herein, the term "noble gas" and similar terms and expressions relates to any spin-polarizable isotope of helium, neon, argon, krypton, xenon or radon. In addition, any mixture of noble gases is included by usage of "noble gas."

Figure 6:
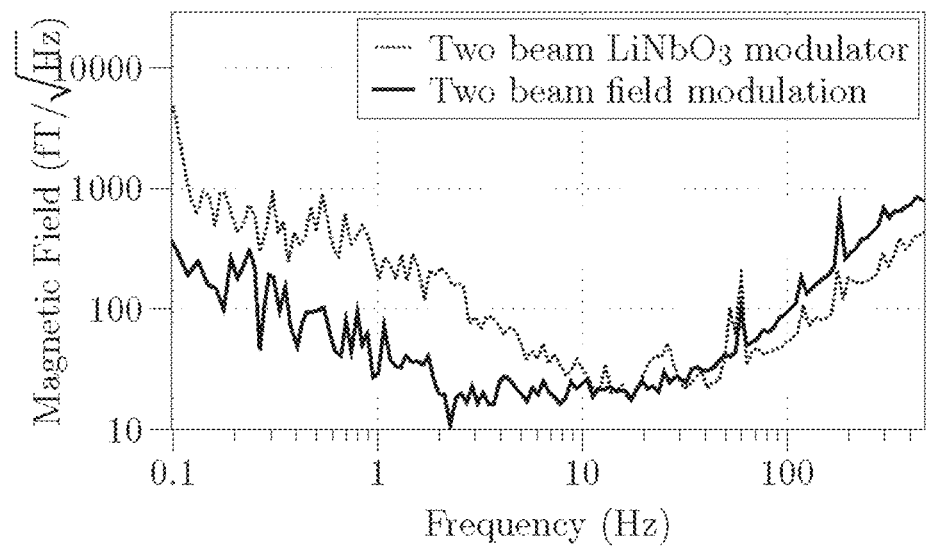
FIG. 6 illustrates test data of an embodiment.

FIG. 6 illustrates magnetometer sensitivity frequency spectrum test data that depicts advantages of embodiments in accordance with the present disclosure. FIG. 6 illustrates a magnetic field strength representing the demodulated, calibrated signal (on the y-axis) from detector 110, as a function of modulation frequency (on the x-axis). Embodiments described herein provide nearly an order of magnitude improvement in sensitivity at 1 Hz due to elimination of discrete polarization modulator 106, which is prone to thermal drift at low frequency. Eliminating discrete polarization modulator 106 and replacing it with modulation from field coil 305 results in a far simpler, more robust and lower cost sensor. Any low frequency drift in the field generated by the coil, which could be picked up by the magnetometer, is eliminated by placing a dc blocking capacitor (a high pass filter) in the modulation field coil circuit. In the attached figure, we believe the sensor is limited by noise generated by the magnetic shields.

Figure 7:
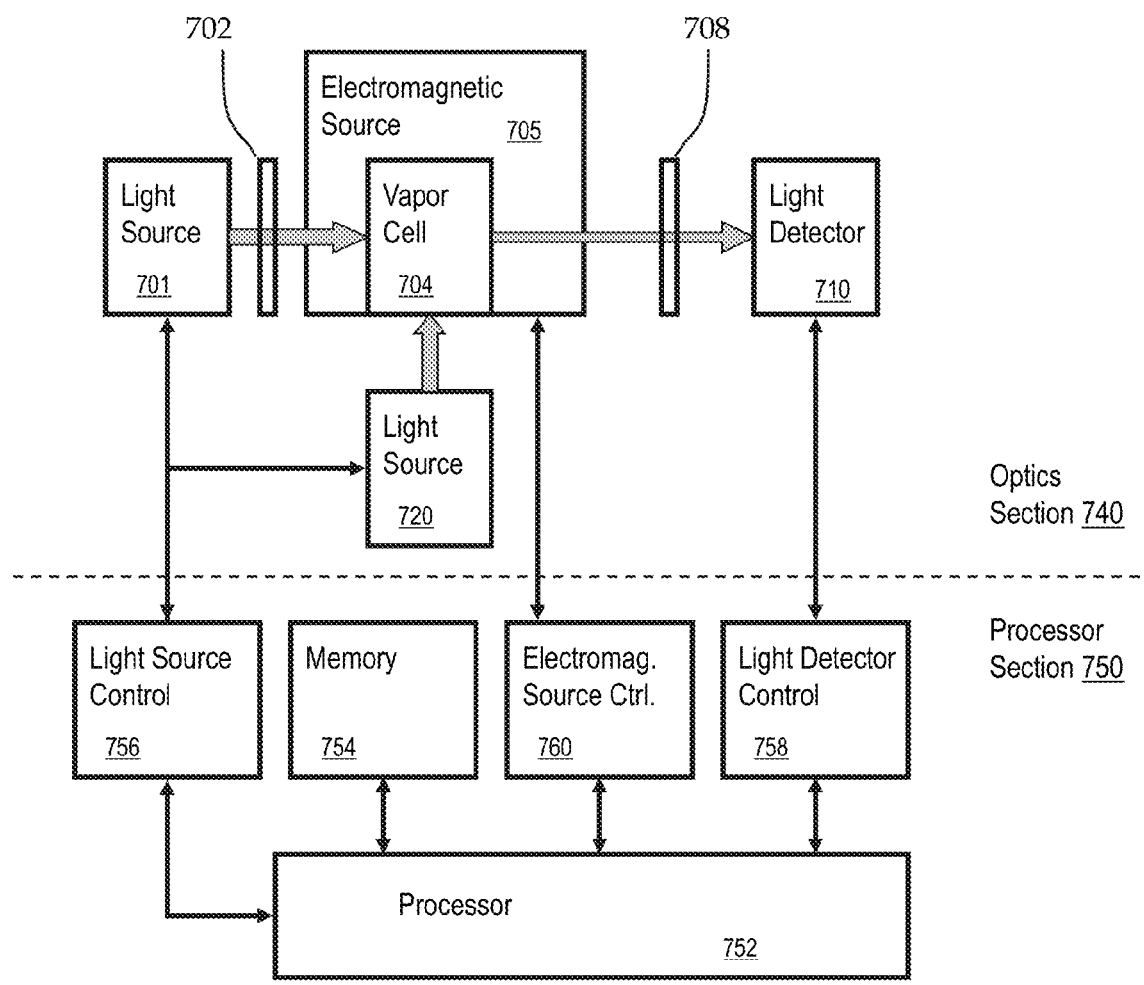
FIG. 7 illustrates an embodiment of a magnetometer system.

FIG. 7 illustrates a system 700 in accordance with an embodiment of the present disclosure. System 700 may include an optics section 740 and a processor section 750. Optics section 740 includes light source 701, polarizer 702, vapor cell 704, polarizer 708, light source 720 and light detector 710 optically connected as shown in FIG. 7. Light source 720 injects a pump light into vapor cell 704, at a right angle to the light injected into vapor cell 704 from light source 701. Optics section 740 may further include an electromagnetic source configured to apply an electromagnetic field at a vector direction perpendicular to both the light from light source 701 and the light from light source 720, e.g., at a vector direction perpendicular to the plane of FIG. 7.

Processor section 750 may include a processor 752 coupled to a memory 754, a light source control 756 configured to control light source 701 and light source 720. Processor section 750 may further include light a detector control 758 to control, analyze and/or interface with light detector 710. Processor section 750 may further include an electromagnetic source control to control, analyze and/or interface with the excitation of electromagnetic source 705. Memory 754 may be configured to store instructions for processor 752, to store data used to operate embodiments in accordance with the present invention, to store measurements produced by the embodiments, and so forth. Various functions to control embodiments, and/or analyze data produced by the embodiments, may be provided by an appropriate module. Appropriate communication interfaces may be provided to integrate embodiments in accordance with the present invention into a larger system (not shown), in order to provide functionality for an apparatus such as a gyroscope, and so forth.

Figure 8:
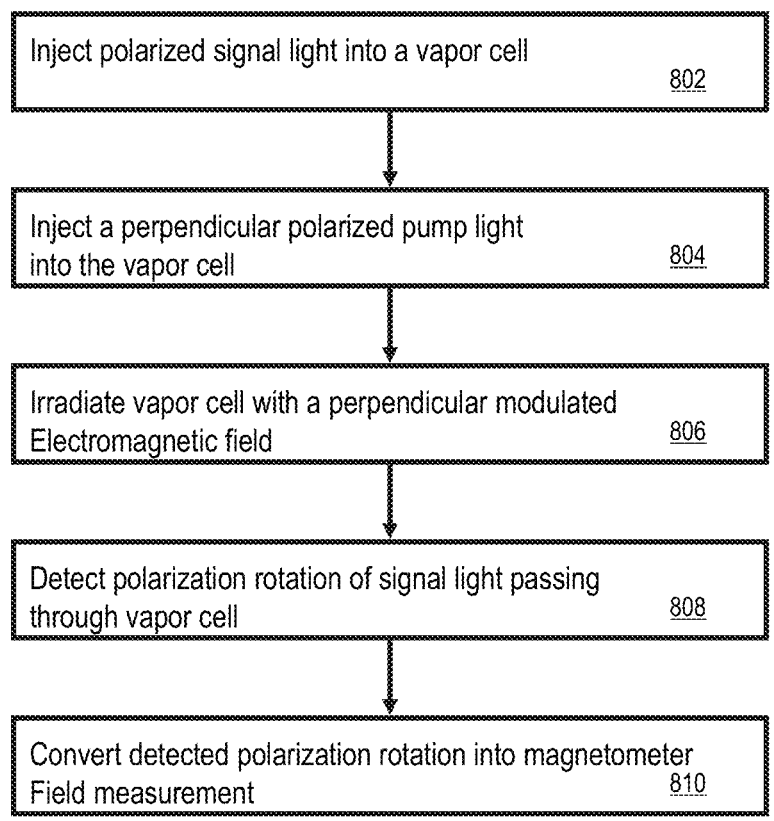
FIG. 8 illustrates a method in accordance with an embodiment of the present disclosure.

FIG. 8 illustrates a process 800 of operating a magnetometer in accordance with an embodiment of the present disclosure. The process may be adapted for use with other sensors that operate on similar scientific principles, or instrumentation that relies upon such sensors, such as navigational gyroscopes. Process 800 begins at block 802, at which a polarized signal light at a known polarization is injected into a vapor cell, e.g., a hermetically-sealed vapor cell that contains an alkali-metal vapor.

Next, control of process 800 transitions to block 804, at which a polarized pump light is injected into the vapor cell at a perpendicular direction to the direction of the polarized signal light.

Next, control of process 800 transitions to block 806, at which the vapor cell is irradiated with a modulated electromagnetic field. The field may be produced by an electromagnetic source, e.g., a coil surrounding the vapor cell. The electromagnetic source is excited by a modulated signal such that an electromagnetic field having a vector direction substantially perpendicular to both the polarized signal light and the polarized pump light is introduced into at least a portion of the vapor cell. The modulated electromagnetic field induces a polarization rotation in the polarized signal light passing through the vapor cell by the Larmor spin precession effect. The modulation parameters of the electromagnetic source are chosen such that the frequency of the modulation is above the magnetometer bandwidth, and the amplitude of modulation is selected such that the atoms in the vapor cell do not exit the SERF regime.

Next, control of process 800 transitions to block 808, at which the polarization rotation of the signal light passing through the vapor cell is detected. For example, detection may be by use of a linear polarizer having an axis of polarization set to be perpendicular to the polarization state of the signal light entering the vapor cell. If there is no polarization rotation in the vapor cell, then the polarizer will ideally extinguish all of the light exiting the vapor cell. However, if polarization rotation takes place in the vapor cell, then a portion of the rotated light will pass the polarizer. A photodetector may be used to convert the amplitude modulated signal into electrical signals.

Next, control of process 800 transitions to block 810, at which the detected signal is demodulated and converted into a measurement of the magnetic field strength.

As used herein, the term "module" refers generally to a logical sequence or association of steps, processes or components. For example, a software module may comprise a set of associated routines or subroutines within a computer program. Alternatively, a module may comprise a substantially self-contained hardware device. A module may also comprise a logical set of processes irrespective of any software or hardware implementation.

As used herein, the term "transmitter" may generally comprise any device, circuit, or apparatus capable of transmitting an optical or electrical signal. The term "receiver" may generally comprise any device, circuit, or apparatus capable of receiving an optical or electrical signal.

The term "computer-readable medium" as used herein refers to any tangible storage and/or transmission medium that participates in storing and/or providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, RAM, PROM, EPROM, FLASH-EPROM, solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

The disclosed methods may be readily implemented in software, such as by using object or object-oriented software development environments that provide portable source code that can be used on a variety of computer or workstation platforms. Alternatively, the disclosed system may be implemented partially or fully in hardware, such as by using standard logic circuits or VLSI design. Whether software or hardware may be used to implement the systems in accordance with various embodiments of the present invention may be dependent on various considerations, such as the speed or efficiency requirements of the system, the particular function, and the particular software or hardware systems being utilized.

While the foregoing is directed to embodiments of the present invention, other and further embodiments of the present invention may be devised without departing from the basic scope thereof. It is understood that various embodiments described herein may be utilized in combination with any other embodiment described, without departing from the scope contained herein. Further, the foregoing description is not intended to be exhaustive or to limit the invention to the precise form disclosed. Modifications and variations are possible in light of the above teachings or may be acquired from practice of the invention. Certain exemplary embodiments may be identified by use of an open-ended list that includes wording to indicate that the list items are representative of the embodiments and that the list is not intended to represent a closed list exclusive of further embodiments. Such wording may include "e.g.," "etc.," "such as," "for example," "and so forth," "and the like," etc., and other wording as will be apparent from the surrounding context.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the terms "any of" followed by a listing of a plurality of items and/or a plurality of categories of items, as used herein, are intended to include "any of," "any combination of," "any multiple of," and/or "any combination of multiples of" the items and/or the categories of items, individually or in conjunction with other items and/or other categories of items.

Moreover, the claims should not be read as limited to the described order or elements unless stated to that effect. In addition, use of the term "means" in any claim is intended to invoke 35 U.S.C. §112, ¶ 6, and any claim without the word "means" is not so intended.

We claim:

1. An apparatus, comprising:
   an optical interface to accept a first light having a predetermined state of linear polarization;
   a pump light source to produce a pump light having circular polarization;
   a vapor cell comprising a sealed vessel containing an alkali-metal gas, the vapor cell further comprising a first input port to receive the first light, a second input port to accept the pump light from a direction perpendicular to the first light, and an output port configured to produce a second light;
   an electromagnetic source configured to apply an electromagnetic field to the vapor cell at a direction perpendicular to the first light and perpendicular to the pump light;
   a second linear polarizer, having an axis of polarization perpendicular to the predetermined state of linear polarization of the first light, the second polarizer configured to receive the second light and to produce a third light;
   and a photodetector configured to receive the third light, to produce an intensity measurement of the third light,
   wherein the output port of the vapor cell comprises the input port of the vapor cell for the first light.

2. The apparatus of claim 1, wherein the optical interface comprises a first linear polarizer having a predetermined first axis of polarization, the first polarizer configured to receive a probe light and to pass the probe light through the first linear polarizer in order to produce the first light.

3. The apparatus of claim 1, further comprising a light source to produce the first light.

4. The apparatus of claim 1, wherein the electromagnetic field comprises a time-varying field modulation.

5. The apparatus of claim 4, wherein the electromagnetic field is modulated with a field strength of about 10 nT peak-to-peak.

6. The apparatus of claim 1, further comprising a three-axis electromagnetic coil configured to cancel an ambient external electromagnetic field.

7. The apparatus of claim 6, wherein the three-axis electromagnetic coil comprises the electromagnetic source.

8. A system, comprising:
   an optics section comprising:
      an optical interface to accept a first light having a predetermined state of linear polarization;

a pump light source to produce a pump light having circular polarization;

a vapor cell comprising a sealed vessel containing an alkali-metal gas, the vapor cell further comprising a first input port to receive the first light, a second input port to accept the pump light from a direction perpendicular to the first light, and an output port configured to produce a second light;

an electromagnetic source configured to apply an electromagnetic field to the vapor cell at a direction perpendicular to the first light and perpendicular to the pump light;

a second linear polarizer, having an axis of polarization perpendicular to the predetermined state of linear polarization of the first light, the second polarizer configured to receive the second light and to produce a third light; and a photodetector configured to receive the third light, to produce an intensity measurement of the third light, wherein the output port of the vapor cell comprises the input port of the vapor cell for the first light; and a processor section comprising:
a processor coupled to a memory;
a light source control module coupled to the processor, the light source control module configured to control a source of the first light and the pump light source;
a light detector control module, the light detector control module configured to control the light detector; and
an electromagnetic source control module, the electromagnetic source control module configured to control the electromagnetic source.

9. The system of claim 8, wherein the optical interface comprises a first linear polarizer having a predetermined first axis of polarization, the first polarizer configured to receive a probe light and to pass the probe light through the first linear polarizer in order to produce the first light.

10. The system of claim 8, wherein the electromagnetic field comprises a time-varying field modulation.

11. The system of claim 8, further comprising:
a mirror configured to reflect the second light into the vapor cell,
wherein the second linear polarizer comprises the first linear polarizer.

12. The system of claim 11, wherein the mirror comprises a mirrored interior surface of the vapor cell.

13. A method, comprising:
polarizing a light with a first linear polarizer to produce polarized signal light;
injecting polarized signal light into a vapor cell;
injecting a circularly polarized pump light into the vapor cell;
irradiating the vapor cell with a perpendicular modulated electromagnetic field;
reflecting the signal light passing through the vapor cell back into the vapor cell;
polarizing the reflected light with a second linear polarizer to produce polarized reflected signal light;
detecting a polarization rotation of reflected signal light passed through the vapor cell; and
converting the detected polarization rotation into magnetometer Field measurement,
wherein the first linear polarizer is used as the second linear polarizer.

14. An apparatus, comprising:
an optical interface to accept a first light having a predetermined state of linear polarization;

a pump light source to produce a pump light having circular polarization;

a vapor cell comprising a sealed vessel containing an alkali-metal gas, the vapor cell further comprising a first input port to receive the first light, a second input port to accept the pump light from a direction perpendicular to the first light, and an output port configured to produce a second light;

an electromagnetic source configured to apply an electromagnetic field to the vapor cell at a direction perpendicular to the first light and perpendicular to the pump light;

a second linear polarizer, having an axis of polarization perpendicular to the predetermined state of linear polarization of the first light, the second polarizer configured to receive the second light and to produce a third light;

and a photodetector configured to receive the third light, to produce an intensity measurement of the third light, wherein the electromagnetic field comprises a time-varying field modulation, modulated at a frequency above the apparatus bandwidth, from about 100 Hz to about 5 kHz.

15. The apparatus of claim 14, wherein the optical interface comprises a first linear polarizer having a predetermined first axis of polarization, the first polarizer configured to receive a probe light and to pass the probe light through the first linear polarizer in order to produce the first light.

16. The apparatus of claim 14, further comprising a light source to produce the first light.

17. The apparatus of claim 14, wherein the electromagnetic field is modulated with a field strength of about 10 nT peak-to-peak.

18. The apparatus of claim 14, further comprising a three-axis electromagnetic coil configured to cancel an ambient external electromagnetic field.

19. The apparatus of claim 18, wherein the three-axis electromagnetic coil comprises the electromagnetic source.

20. An apparatus, comprising:
an optical interface to accept a first light having a predetermined state of linear polarization;
a pump light source to produce a pump light having circular polarization;
a vapor cell comprising a sealed vessel containing an alkali-metal gas, the vapor cell further comprising a first input port to receive the first light, a second input port to accept the pump light from a direction perpendicular to the first light, and an output port configured to produce a second light;
an electromagnetic source configured to apply an electromagnetic field to the vapor cell at a direction perpendicular to the first light and perpendicular to the pump light;
a second linear polarizer, having an axis of polarization perpendicular to the predetermined state of linear polarization of the first light, the second polarizer configured to receive the second light and to produce a third light;
and a photodetector configured to receive the third light, to produce an intensity measurement of the third light,
wherein the electromagnetic field comprises a time-varying field modulation, modulated with a field strength of less than the SERF regime field limit.

21. The apparatus of claim 20, wherein the optical interface comprises a first linear polarizer having a predetermined first axis of polarization, the first polarizer configured to receive a probe light and to pass the probe light through the first linear polarizer in order to produce the first light.

22. The apparatus of claim 20, further comprising a light source to produce the first light.

23. The apparatus of claim 20, wherein the electromagnetic field is modulated with a field strength of about 10 nT peak-to-peak.

24. The apparatus of claim 20, further comprising a three-axis electromagnetic coil configured to cancel an ambient external electromagnetic field.

25. The apparatus of claim 24, wherein the three-axis electromagnetic coil comprises the electromagnetic source.

26. An apparatus, comprising:
an optical interface to accept a first light having a predetermined state of linear polarization;
a pump light source to produce a pump light having circular polarization;
a vapor cell comprising a sealed vessel containing an alkali-metal gas, the vapor cell further comprising a first input port to receive the first light, a second input port to accept the pump light from a direction perpendicular to the first light, and an output port configured to produce a second light;
an electromagnetic source configured to apply an electromagnetic field to the vapor cell at a direction perpendicular to the first light and perpendicular to the pump light;
a mirror configured to reflect the second light into the vapor cell;
a second linear polarizer, having an axis of polarization perpendicular to the predetermined state of linear polarization of the first light, the second polarizer configured to receive the second light and to produce a third light, wherein the second linear polarizer comprises the first linear polarizer;
and a photodetector configured to receive the third light, to produce an intensity measurement of the third light.

27. The apparatus of claim 26, wherein the optical interface comprises a first linear polarizer having a predetermined first axis of polarization, the first polarizer configured to receive a probe light and to pass the probe light through the first linear polarizer in order to produce the first light.

28. The apparatus of claim 26, further comprising a light source to produce the first light.

29. The apparatus of claim 26, wherein the electromagnetic field comprises a time-vary infield modulation.

30. The apparatus of claim 26, wherein the electromagnetic field is modulated with a field strength of about 10 nT peak-to-peak.

31. The apparatus of claim 26, further comprising a three-axis electromagnetic coil configured to cancel an ambient external electromagnetic field.

32. The apparatus of claim 31, wherein the three-axis electromagnetic coil comprises the electromagnetic source.

33. The apparatus of claim 26, wherein a single birefringent crystal comprises the first linear polarizer and the second linear polarizer.

34. The apparatus of claim 26, wherein the mirror comprises a mirrored interior surface of the vapor cell.

35. A system, comprising:
an optics section comprising:
an optical interface to accept a first light having a predetermined state of linear polarization;
a pump light source to produce a pump light having circular polarization;
a vapor cell comprising a sealed vessel containing an alkali-metal gas, the vapor cell further comprising a first input port to receive the first light, a second input port to accept the pump light from a direction perpendicular to the first light, and an output port configured to produce a second light;
an electromagnetic source configured to apply an electromagnetic field to the vapor cell at a direction perpendicular to the first light and perpendicular to the pump light, wherein the electromagnetic field comprises a time-varying field modulation modulated at a frequency above the optics section bandwidth, from about 100 Hz to about 5 kHz;
a second linear polarizer, having an axis of polarization perpendicular to the predetermined state of linear polarization of the first light, the second polarizer configured to receive the second light and to produce a third light; and
a photodetector configured to receive the third light, to produce an intensity measurement of the third light; and
a processor section comprising:
a processor coupled to a memory;
a light source control module coupled to the processor, the light source control module configured to control a source of the first light and the pump light source;
a light detector control module, the light detector control module configured to control the light detector; and
an electromagnetic source control module, the electromagnetic source control module configured to control the electromagnetic source.

36. The system of claim 35, wherein the optical interface comprises a first linear polarizer having a predetermined first axis of polarization, the first polarizer configured to receive a probe light and to pass the probe light through the first linear polarizer in order to produce the first light.

37. The system of claim 35, further comprising:
a mirror configured to reflect the second light into the vapor cell,
wherein the second linear polarizer comprises the first linear polarizer.

38. The system of claim 37, wherein the mirror comprises a mirrored interior surface of the vapor cell.

39. A system, comprising:
an optics section comprising:
an optical interface to accept a first light having a predetermined state of linear polarization;
a pump light source to produce a pump light having circular polarization;
a vapor cell comprising a sealed vessel containing an alkali-metal gas, the vapor cell further comprising a first input port to receive the first light, a second input port to accept the pump light from a direction perpendicular to the first light, and an output port configured to produce a second light;
an electromagnetic source configured to apply an electromagnetic field to the vapor cell at a direction perpendicular to the first light and perpendicular to the pump light, wherein the electromagnetic field comprises a time-varying field modulation modulated with a field strength of less than the SERF regime field limit;
a second linear polarizer, having an axis of polarization perpendicular to the predetermined state of linear polarization of the first light, the second polarizer configured to receive the second light and to produce a third light; and
a photodetector configured to receive the third light, to produce an intensity measurement of the third light; and a processor section comprising:
- a processor coupled to a memory;
- a light source control module coupled to the processor, the light source control module configured to control a source of the first light and the pump light source;
- a light detector control module, the light detector control module configured to control the light detector; and
- an electromagnetic source control module, the electromagnetic source control module configured to control the electromagnetic source.

40. The system of claim 39, wherein the optical interface comprises a first linear polarizer having a predetermined first axis of polarization, the first polarizer configured to receive a probe light and to pass the probe light through the first linear polarizer in order to produce the first light.

41. The system of claim 39, further comprising:
a mirror configured to reflect the second light into the vapor cell,
wherein the second linear polarizer comprises the first linear polarizer.

42. The system of claim 41, wherein the mirror comprises a mirrored interior surface of the vapor cell.

43. A method, comprising:
injecting polarized signal light into a vapor cell;
injecting a circularly polarized pump light into the vapor cell;
irradiating the vapor cell with a perpendicular, time-varying modulated electromagnetic field, wherein the electromagnetic field is modulated at a frequency above the apparatus bandwidth, from about 100 Hz to about 5 kHz;
detecting a polarization rotation of signal light passing through vapor cell; and
converting the detected polarization rotation into magnetometer Field measurement.

44. A method, comprising:
injecting polarized signal light into a vapor cell;
injecting a circularly polarized pump light into the vapor cell;
irradiating the vapor cell with a perpendicular, time-varying modulated electromagnetic field, wherein the electromagnetic field is modulated with a field strength of less than the SERF regime field limit;
detecting a polarization rotation of signal light passing through vapor cell; and
converting the detected polarization rotation into magnetometer Field measurement.

* * * * *